United States Patent
Singerl et al.

(10) Patent No.: US 7,561,857 B2
(45) Date of Patent: Jul. 14, 2009

(54) MODEL NETWORK OF A NONLINEAR CIRCUITRY

(75) Inventors: Peter Singerl, Villach (AT); Gernot Kubin, Graz (AT)

(73) Assignee: Infineon Technologies AG, Munich (DE)

( * ) Notice: Subject to any disclaimer, the term of this patent is extended or adjusted under 35 U.S.C. 154(b) by 505 days.

(21) Appl. No.: 11/512,635

(22) Filed: Aug. 30, 2006

(65) Prior Publication Data
US 2008/0057882 A1    Mar. 6, 2008

(51) Int. Cl.
*H04B 17/00* (2006.01)

(52) U.S. Cl. .................. 455/114.3; 375/296; 330/149

(58) Field of Classification Search .......... 455/91, 455/114.1–114.3, 115.1–115.4, 126; 375/295, 375/296; 330/10, 49, 51, 149
See application file for complete search history.

(56) References Cited

U.S. PATENT DOCUMENTS

| | | | |
|---|---|---|---|
| 6,798,843 B1 * | 9/2004 | Wright et al. | 375/296 |
| 7,071,777 B2 * | 7/2006 | McBeath et al. | 330/149 |
| 2006/0078065 A1 | 4/2006 | Cai et al. | |
| 2006/0133536 A1 | 6/2006 | Rexberg | |

OTHER PUBLICATIONS

"A Robust Digital Baseband Predistorter Constructed Using memory Polynomials", Lei Ding, G. Tong Zhou, Dennis R. Morgan, Zhengxiang Ma, J. Stevenson Kenney, Jaehyeong Kim and Charles R. Giardina, IEEE Transactions on Communications, vol. 52, No. 1, Jan. 2004, pp. 159-165.

* cited by examiner

*Primary Examiner*—Thanh C Le
(74) *Attorney, Agent, or Firm*—Eschweiler & Associates, LLC

(57) ABSTRACT

A model network of a nonlinear circuitry includes one or more static nonlinear elements and a plurality of linear filters with transfer functions. A method for determining the model network includes performing an input amplitude-to-output amplitude measurement of the nonlinear circuitry and performing an input amplitude-to-output phase measurement of the nonlinear circuitry. The transfer functions are calculated on the basis of results of the input amplitude-to-output amplitude measurement and input amplitude-to-output phase measurement.

33 Claims, 3 Drawing Sheets

MODEL NETWORK OF A NONLINEAR CIRCUITRY

FIELD OF THE INVENTION

The invention relates to nonlinear systems and more specifically to modeling and predistortion linearization of nonlinear circuitry for communications systems.

BACKGROUND OF THE INVENTION

In many technical fields, linearization of nonlinear circuitry is used to compensate for unwanted effects caused by the nonlinear behavior of the nonlinear circuitry. One possibility to linearize nonlinear circuitry is to predistort the signal input into the nonlinear circuitry to ensure that the output signal of the nonlinear circuitry is, in the ideal case, linearly related to the input signal of the predistorter.

Power amplifiers are used in wireline and wireless communications systems for transferring high-rate data signals from a transmitter to a receiver. Power amplifiers are highly cost intensive during production and also during operation. Therefore, it is desirable to operate power amplifiers in a most efficient way. As the efficiency of a power amplifier increases with nonlinearity, power amplifiers are typically driven in the nonlinear region. This leads to spectral regrowth and intermodulation distortion in the amplified signal band. These effects increase the bit error rate at the receiver and cause unacceptably high co-channel interference.

As a countermeasure to decrease the unwanted effects of nonlinearity, a predistorter may be employed to predistort the signal input to the power amplifier. Signal predistortion allows creation of low-price transmitter devices fulfilling given spectral masks for the transmission signal even though the power amplifier is driven in the nonlinear region.

It is known to use models (i.e. model networks) to approximately reproduce the nonlinear behavior of the power amplifier or, generally speaking, the nonlinear circuitry. These models may be used for simulation purposes, for instance to perform a bit error rate simulation. They may also be used for the purpose of minimizing the unwanted effects caused by the nonlinear behavior of the nonlinear circuitry.

Typically, nonlinear circuitry is modeled by a network comprising two static nonlinearities called amplitude-to-amplitude modulation conversion (AM/AM-conversion) and amplitude-to-phase modulation conversion (AM/PM-conversion). The AM/AM-conversion maps an input signal amplitude into an output signal amplitude, which may, for instance, be represented by a series expansion around the input signal amplitude. Analogously, the AM/PM-conversion maps an input signal amplitude into an output signal phase, which may equally be represented by a series expansion around the input signal amplitude. Generally, both static nonlinearities are purely dependent on the input signal magnitude. Identifying the nonlinear circuitry means to determine these two static nonlinearities—i.e. the coefficients of the series expansions in case the nonlinearities are expressed by series. Conventionally, this may be accomplished by simple two-tone or single-tone measurements. In these measurements, the power of the input signal to the nonlinear circuitry is varied and the power and the phase difference of the fundamentals at the output of the nonlinear circuitry are recorded.

Dynamic effects, also known as memory effects, are another problem encountered in nonlinear circuitries. Memory effects in power amplifiers typically show up as a non-symmetrical spectrum around the carrier at the output of the power amplifier. They are caused by thermal or electrothermal processes in the power amplifier. As the term "memory effects" indicates, there is a dependency not only on the present value, e.g. sample, but also on previous values, e.g. samples, of the input signal.

Conventional concepts based on static AM/AM-conversion and AM/PM-conversion cannot model the dynamic or memory behavior of the power amplifier. However, the compensation of memory effects is especially important for radio frequency wideband applications.

From a theoretical point of view, it is possible to model such dynamic or memory effects by identifying the nonlinear circuitry by means of adaptive algorithms, for instance LMS (least means squares), RLS (recursive least squares). However, this requires in general a costly measurement system comprising a complex signal generator, analog-to-digital converters, a digital signal processor etc. Compared to the AM/AM and AM/PM measurements, which may be carried out by a simple network analyzer using a one-tone or two-tone input signal according to the conventional approach. The use of adaptive algorithms involves significantly higher computational efforts and system requirements.

SUMMARY OF THE INVENTION

The following presents a simplified summary in order to provide a basic understanding of one or more aspects and/or embodiments of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

A model network of a nonlinear circuitry comprises one or more static nonlinear elements and a plurality of linear filters with transfer functions. A method for determining the model network comprises performing an input amplitude-to-output amplitude measurement of the nonlinear circuitry and performing an input amplitude-to-output phase measurement of the nonlinear circuitry. The transfer functions are calculated on the basis of results of the input amplitude-to-output amplitude measurement and input amplitude-to-output phase measurement.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

Aspects of the invention are made more evident in the following detailed description of some embodiments when read in conjunction with the attached drawing figures, wherein.

DETAILED DESCRIPTION OF THE INVENTION

Figure 1:
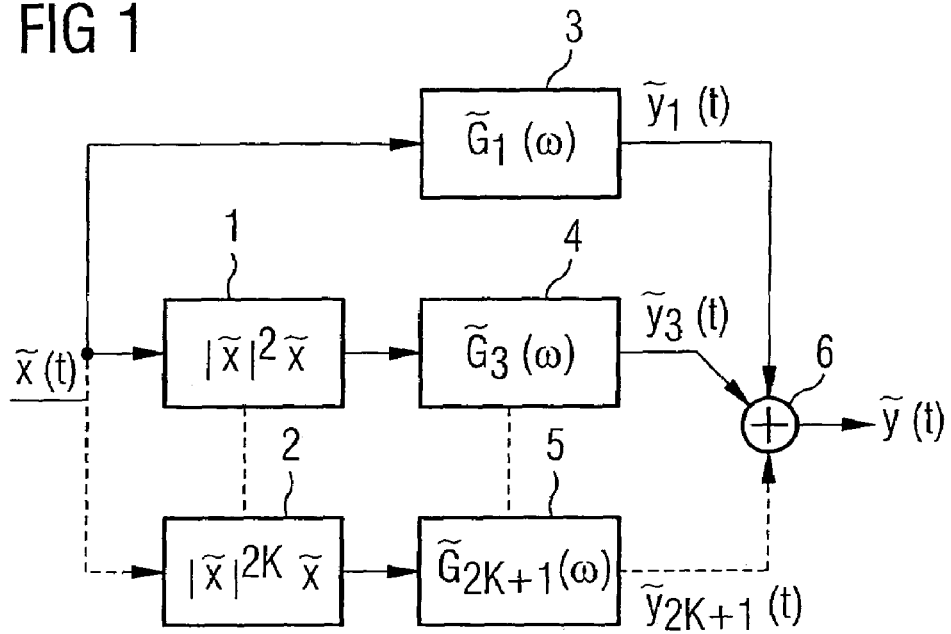
FIG. 1 is a model network constructed with memory polynomials for describing the nonlinear behavior of a power amplifier.

From nonlinear system theory it is known that a nonlinear system or circuit may be described in terms of Volterra kernels. Briefly, the nonlinear system may be represented by an operator H. It is assumed that an input signal $$x(t) = a(t) \cdot \cos(\omega_c t + \phi(t)) \quad (1)$$

is input into the nonlinear system, with $\omega_c$ being the carrier frequency, $\phi(t)$ being the time-dependent phase and $a(t)$ being the time-dependent amplitude of the input signal. The output signal of the nonlinear system may be expressed by $$y(t) = H[x(t)] = \sum_{n=1}^{N} y_n(t) \quad (2)$$

$$y_n(t) = \int_0^\infty \cdots \int_0^\infty h_n(\tau_1, \ldots, \tau_n) \prod_{i=1}^n x(t - \tau_i) d\tau_i.$$

Thus, the output signal $y(t)$ is expanded in a series of component functions $y_n(t)$. Each component function $y_n(t)$ is described by a Volterra integral, wherein the number N of component functions denotes the order of the nonlinearity. The terms $h_n(\tau_1, \ldots, \tau_n)$ are known as (time-domain) Volterra kernels of the order n.

From equation (2), it is apparent that Volterra kernels $h_n(\tau_1, \ldots, \tau_n)$ are used to describe a nonlinear system in a similar way as the impulse response is used to describe a linear system. In linear system theory, the output signal of a linear system is the convolution of the input signal with the impulse response. Analogously, the output signal $y(t)$ of the nonlinear system is the multi-dimensional convolution of the input signal $x(t)$ with a series expansion of Volterra kernels $h_n(\tau_1, \ldots, \tau_n)$. In fact, the first order Volterra kernel $h_1(\tau)$ is identical to the impulse response of a linear system. As the concept of describing a system by an impulse response is limited to linear systems, the Volterra kernel representation may be intuitively understood as a generalization of the impulse response concept to nonlinear systems.

Memory polynomials are a simplified complex baseband Volterra model in which only Volterra kernels along the diagonals in the multi-dimensional space and not the full Volterra kernels are considered, i.e.

$$\tilde{h}_{2k+1}(\tau_1, \ldots, \tau_{2k+1}) = 0 \text{ for } \tau_1 \neq \tau_2 \neq \ldots \neq \tau_{2k+1}. \quad (3)$$

It is to be noted that even order kernels do not exist in the baseband Volterra representation, and therefore, the index n is replaced by $2k+1$. "˜" is used to indicate that the symbol beneath refers to a baseband quantity.

Thus, the continuous-time memory polynomial model can be expressed by $$\tilde{y}(t) = \sum_{k=0}^{\lceil L/2 \rceil - 1} \int_0^\infty \tilde{g}_{2k+1}(\tau) |\tilde{x}(t-\tau)|^{2k} \tilde{x}(t-\tau) d\tau \quad (4)$$

$$= \sum_{k=0}^{\lceil L/2 \rceil - 1} \tilde{g}_{2k+1}(t) * |\tilde{x}(t)|^{2k} \tilde{x}(t)$$

where $\tilde{g}_{2k+1}(\tau) = \tilde{h}_{2k+1}(\tau, \ldots, \tau)$ describes the time-domain Volterra kernels along the diagonals in a multi-dimensional space, and "*" denotes the convolution operator. L corresponds to N in equation (2), i.e. denotes the order of the nonlinearity.

FIG. 1 illustrates a complex baseband model constructed with memory polynomials. The model comprises a bank of static nonlinearities 1, 2 given by $|\tilde{x}|^2 \tilde{x}, |\tilde{x}|^4 \tilde{x}, \ldots, |\tilde{x}|^{2k} \tilde{x}$ and unknown linear filters 3, 4, 5. The static nonlinearities 1, 2 are arranged in parallel and are each serially coupled to one of the unknown linear filters 4, 5. The baseband input signal $\tilde{x}(t)$ is fed into the input of linear filter 3. The outputs of the filters 3, 4, 5 are combined by an adder 6 to yield the output signal $\tilde{y}(t)$. $\tilde{G}_{2k+1}(\omega_m) = F\{\tilde{g}_{2k+1}(t)\}$ denotes the Fourier transform of the diagonal time-domain Volterra kernels in (4) for $k=0, \ldots, K$ where $K = \lceil L/2 \rceil - 1$.

Figure 2:
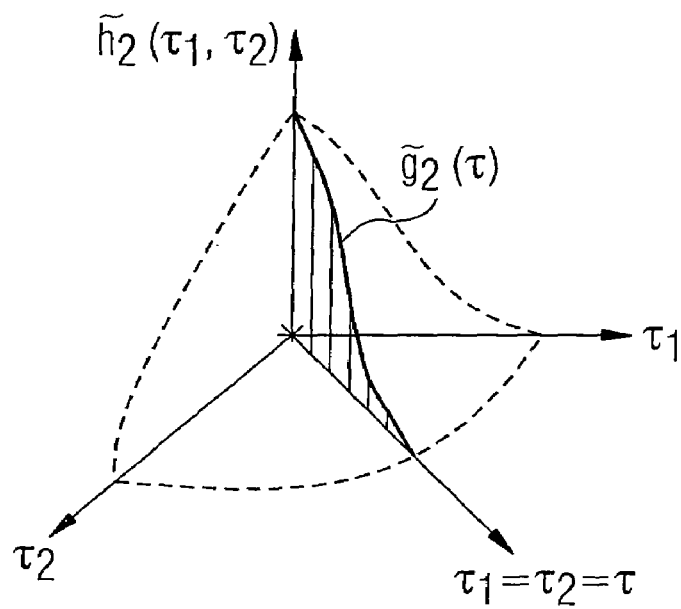
FIG. 2 is a diagram illustrating a two-dimensional time-domain Volterra kernel and the corresponding diagonal kernel.

FIG. 2 illustrates a two-dimensional baseband time-domain Volterra kernel $\tilde{h}_2(\tau_1, \tau_2)$, the cut along the diagonal $\tau_1 = \tau_2$ and the corresponding diagonal baseband time-domain Volterra kernel $\tilde{g}_2(\tau) = \tilde{h}_2(\tau, \tau)$. As even-order kernels do not exist in the baseband Volterra representation, FIG. 2 serves simply to show the concept of diagonal kernels.

Embodiments of the invention contemplate that the two-tone response of a complex Volterra system can be expressed in a similar form as the two-tone response of a quasi-memoryless system. This makes it possible to identify a memory-containing nonlinear circuitry represented by the model network depicted in FIG. 1 by performing simple two-tone measurements of the nonlinear circuitry (e.g. power amplifier). These measurements, which will be explained below in conjunction with FIG. 3, only require standard measurement equipment, namely a sinewave generator and a network analyzer.

Figure 3:
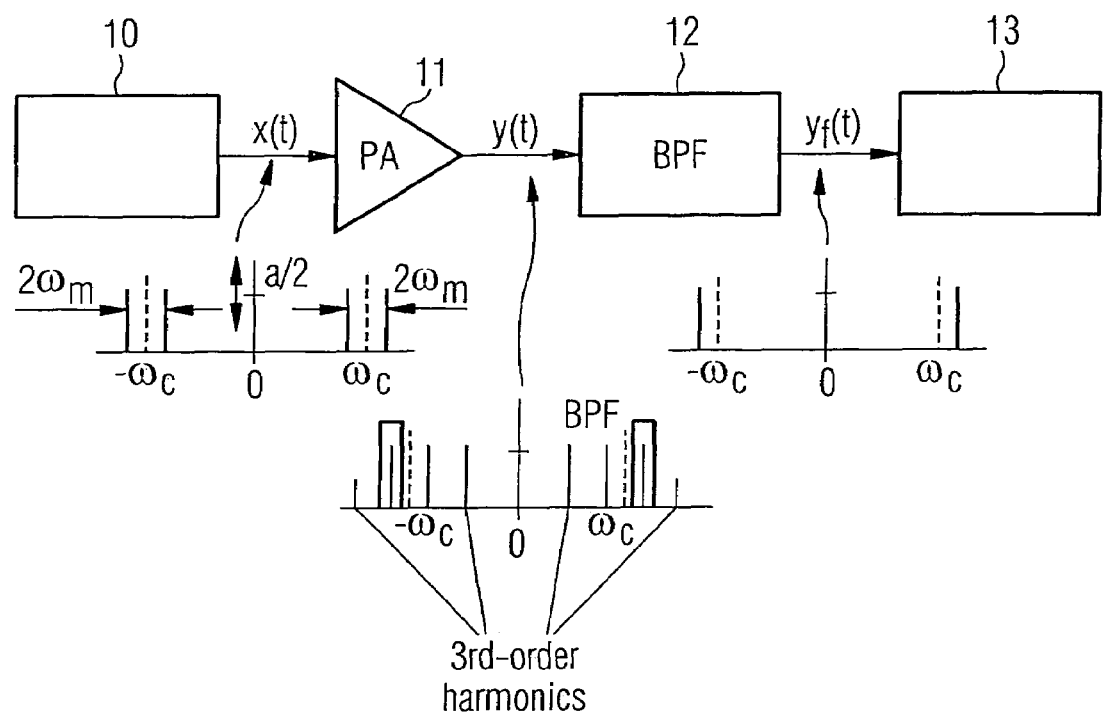
FIG. 3 is a block diagram illustrating a system for performing frequency dependent AM/AM and AM/PM measurements.

FIG. 3 is a block diagram of an exemplary measurement setup. A signal source, i.e. sinewave generator 10 generates a two-tone RF (radio frequency) signal $x(t) = a[\cos((\omega_c + \omega_m)t) + \cos((\omega_c - \omega_m)t)]$ to be input into a power amplifier (PA) 11. $\omega_m$ is a tuning frequency. The power amplifier 11 may be for instance a 2.2-GHz, 90-W Class AB RF power amplifier. The power amplifier 11 output $y(t)$ is coupled to an input of a bandpass filter (BPF) 12 having its center frequency at $\pm(\omega_c + \omega_m)$. The filtered signal $y_f(t)$, i.e. the fundamental of the output signal spectrum at $\omega_m$, is examined in a signal analyzer, i.e. network analyzer 13 in view of its amplitude a and the relative phase of the filtered signal $y_f(t)$ in relation to the signal phase at the input of the power amplifier 11.

In the following, calculation of the transfer functions $\tilde{G}_{2k+1}(\omega)$ of the unknown linear filters 3, 4, 5 of the complex baseband model depicted in FIG. 1 for $k=0, \ldots, K$ is shown. The baseband two-tone signal corresponding to the passband signal $x(t)$ is denoted by $\tilde{x}(t) = a \cos(\omega_m t + \phi)$. If this baseband two-tone signal $\tilde{x}(t)$ is applied to the memory polynomial model of equation (4), it is obtained $$\tilde{y}(t) = \sum_{k=0}^{\lceil L/2 \rceil - 1} \left(\frac{a}{2}\right)^{2k+1} \int_0^\infty \tilde{g}_{2k+1}(\tau)[\exp(j(\omega_m(t-\tau)+\phi)) + \exp(-j(\omega_m(t-\tau)+\phi))]^{2k+1} d\tau. \quad (5)$$

By evaluating the $(2k+1)$-th power of the expression within the brackets of equation (5), equation (5) can be rewritten as $$\tilde{y}(t) = \sum_{k=0}^{\lceil L/2 \rceil - 1} \left(\frac{a}{2}\right)^{2k+1} \sum_{n=0}^{2k+1} \binom{2k+1}{n} \exp[j((2n-2k-1)\omega_m t + (2n-2k-1)\phi)] \times \int_0^\infty \tilde{g}_{2k+1}(\tau) \exp(-j(2n-2k-1)\omega_m \tau) d\tau. \quad (6)$$

This yields for the fundamental angular frequency at $\omega_m$ with $n=k+1$ $$\tilde{y}_f(t) = \exp(j(\omega_m t + \phi)) \sum_{k=0}^{\lceil L/2 \rceil - 1} \left(\frac{a}{2}\right)^{2k+1} \binom{2k+1}{k+1} \tilde{G}_{2k+1}(\omega_m). \quad (7)$$

This equation contains the unknown linear filters $\tilde{G}_{2k+1}(\omega)$ for $k=0, \ldots, K$.

Thus, the filtered two-tone response of the baseband complex memory polynomial model in equation (7) can be rewritten as $$\tilde{y}_f(t) = |v(a, \omega_m)| \exp(j(\omega_m t + \phi + \arg\{v(a, \omega_m)\})) \quad (8)$$

where $$v(a, \omega_m) = \sum_{k=0}^{\lceil L/2 \rceil - 1} \left(\frac{a}{2}\right)^{2k+1} \binom{2k+1}{k+1} \tilde{G}_{2k+1}(\omega_m). \quad (9)$$

It is apparent that the two-tone response of the complex baseband Volterra system in equation (8) is in a similar form as the response of a quasi-memoryless system. For this reason $|v(a,\omega)|$ in equation (8) is defined as the frequency-dependent AM/AM-conversion and $\arg\{v(a,\omega)\}$ in equation (8) as the frequency-dependent AM/PM-conversion.

$v(a,\omega_m)$ describes a complex function which depends on both, the signal amplitude a and the modulation frequency $\omega_m$ of the input signal. Because the memory polynomial model in equation (4) is purely dependent on the $\lceil L/2 \rceil$ complex linear filters (diagonal frequency-domain Volterra kernels), it is possible to estimate them from the measured frequency-dependent AM/AM-conversion and AM/PM-conversion in equation (9) for $\lceil L/2 \rceil$ different input signal magnitudes $a_i$, $i=1, \ldots, \lceil L/2 \rceil$.

In one embodiment of the invention, the network analyzer may comprise a measurement unit and a calculation unit such as a processor or controller unit. Alternately, a separate processor or controller may be employed to perform the above calculations and any such embodiments are contemplated as falling within the scope of the invention.

Figure 4:
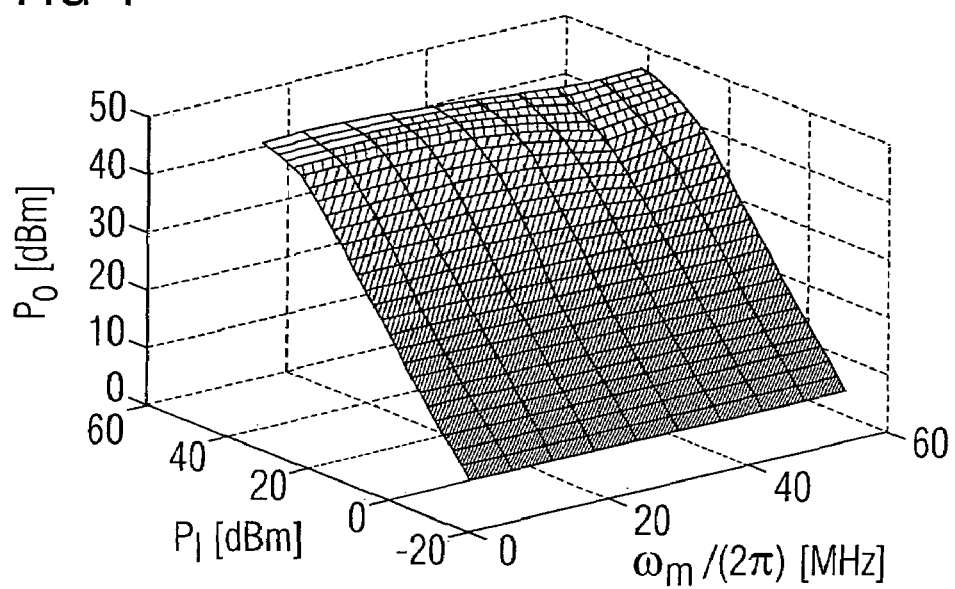
FIG. 4 is a diagram illustrating the amplifier output power versus a two-dimensional amplifier input power and amplifier input frequency representation.

FIG. 4 shows the output power $P_O=10 \log(|v(a,\omega)|^2/(2R \times 10^{-3}))$ of the simulated frequency-dependent AM/AM-conversion version of the 2.2-GHz, 90-W Class AB RF power amplifier 11 excited with the passband two-tone signal x(t) over the input signal power range of $P_I=10 \log(a^2/(2R \times 10^{-3})) = (-10 \ldots 42)$ dBm, where $R=50\Omega$ denotes the input impedance of the RF power amplifier 11. The modulation frequency ranges from $\omega_m/(2\pi)=(6 \ldots 60)$ MHz. The corresponding frequency-dependent AM/PM-conversion is depicted in FIG. 5 and yields $\arg\{v(a,\omega_m)\}$.

Figure 5:
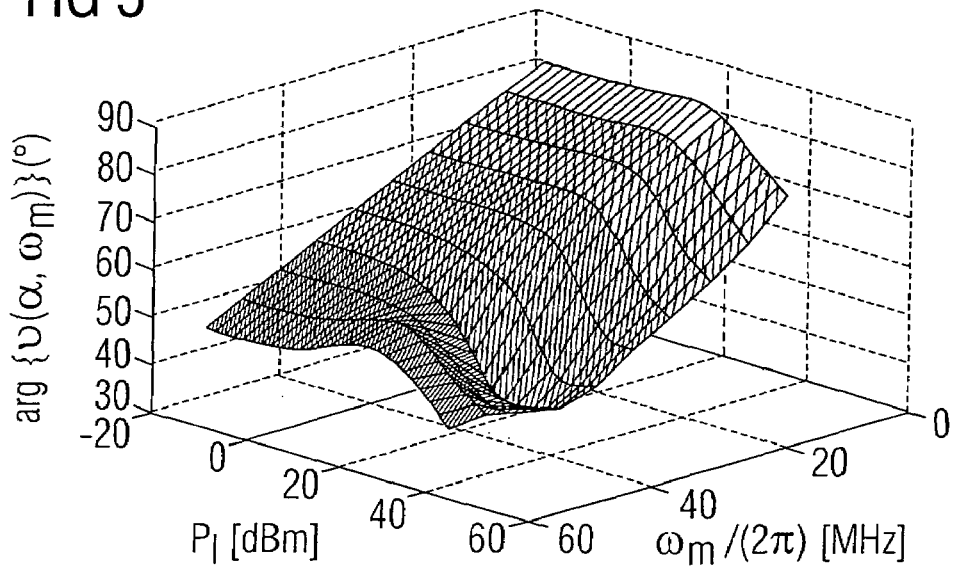
FIG. 5 is a diagram illustrating the amplifier output power versus a two-dimensional amplifier input power and amplifier input frequency representation.

Taking into account equation (9), it is sufficient to measure the two-dimensional areas depicted in FIGS. 4 and 5 to calculate the unknown complex linear filters 3, 4, 5 in the complex baseband model constructed with memory polynomials (FIG. 1).

Because in practical applications, these measurements are noisy (imperfect measurements, model inaccuracies), a classical linear least squares problem may be formulated to estimate the unknown linear filters $\tilde{G}_{2k+1}(\omega_m)$ in equation (9) by $$\hat{G}(\omega_m) = (A^T A)^{-1} A^T \hat{v}(\omega_m) \quad (10)$$

where $$\hat{v}(\omega_m) = [\hat{v}(a_1,\omega_m), \hat{v}(a_2,\omega_m), \ldots, \hat{v}(a_N,\omega_m)]^T \quad (11)$$

denotes an $N \times 1$ vector ($N > \lceil L/2 \rceil$), whose components are the measured (noisy) versions of the frequency-dependent AM/AM and AM/PM-conversion entries in equation (9). The $\lceil L/2 \rceil \times 1$ vector $$\hat{G}(\omega_m) = [\hat{G}_1(\omega_m), \hat{G}_3(\omega_m), \ldots, \hat{G}_{2\lceil L/2 \rceil - 1}(\omega_m)]^T \quad (12)$$

describes the estimated linear filters 3, 4, 5 in FIG. 1 for the modulation frequency $\omega_m$.

The $N \times \lceil L/2 \rceil$ observation matrix A in equation (10) is defined by $$A = \begin{pmatrix} \frac{a_1}{2} & 3\left(\frac{a_1}{2}\right)^3 & \cdots & \binom{2\lceil \frac{L}{2} \rceil - 1}{\lceil \frac{L}{2} \rceil} \left(\frac{a_1}{2}\right)^{2\lceil \frac{L}{2} \rceil - 1} \\ \vdots & \vdots & & \vdots \\ \frac{a_N}{2} & 3\left(\frac{a_N}{2}\right)^3 & \cdots & \binom{2\lceil \frac{L}{2} \rceil - 1}{\lceil \frac{L}{2} \rceil} \left(\frac{a_N}{2}\right)^{2\lceil \frac{L}{2} \rceil - 1} \end{pmatrix}. \quad (13)$$

To obtain the frequency responses of the unknown linear filters $\tilde{G}_{2k+1}(\omega)$ over the frequency-range of interest, the least squares problem in equation (10) is solved for different modulation frequencies $\omega_m$. The number of parameters required to model the power amplifier 11 in the baseband-domain by the memory polynomial model depicted in FIG. 1 is dependent from the design of the linear filters 3, 4, 5 and K. As already mentioned, K is related to the order of the nonlinearity of the power amplifier 11 and can be estimated from the frequency-dependent AM/AM-conversion and AM/PM-conversion measurements.

Further, it is to be noted that the frequency-dependent AM/AM-conversion and AM/PM-conversion can not only be considered for the fundamental of the output signal spectrum at $\omega_m$. It can also be derived for the harmonics of the input signal, e.g. the third-order intermodulation distortion (IMD3) at $3\omega_m$. In this case, the bandpass filter 12 should have a center frequency at $\pm(\omega_c + 3\omega_m)$.

The above scheme for constructing memory polynomial models from frequency-dependent AM/AM-measurements and AM/PM-measurements may be generalized to any complex Volterra model in which only the frequency-domain Volterra kernels along the diagonals are considered. Thus, although the concept outlined above does not fully describe any Volterra system (because Volterra kernels outside the diagonals are discarded), the concept, on the other hand, is not limited to memory polynomials. If the concept of the AM/AM-conversion and the AM/PM-conversion is extended for more general nonlinear models as memory polynomial models, the baseband two-tone response of the power amplifier 11 may be written as $$\tilde{y}(t) = \sum_{k=0}^{\lceil L/2 \rceil - 1} \left(\frac{a}{2}\right)^{2k+1} \sum_{n_1=1}^{2} \cdots \sum_{n_{2k+1}=1}^{2} \exp\left(j \sum_{i=1}^{2k+1} (-1)^{n_i+1} \omega_m t\right) \times \tilde{H}_{2k+1}((-1)^{n_1-1}\omega_m, \ldots, (-1)^{n_{2k+1}-1}\omega_m). \quad (14)$$

$\tilde{H}_{2k+1}(\omega_1, \ldots, \omega_{k+1})$ are the frequency-domain baseband Volterra kernels associated to the time-domain Volterra kernels $\tilde{h}_{2k+1}(\tau_1, \ldots, \tau_{2k+1})$ set out in equation (3). If this two-tone response is passed through the complex linear filter 12 (center angular frequency is $\omega_m$) and the magnitude a and the angular frequency $\omega_m$ of the input signal is swept, one obtains $$\tilde{y}_f(t) = \exp(j(\omega_m t + \phi)) \sum_{k=0}^{\lceil L/2 \rceil} \left(\frac{a}{2}\right)^{2k+1} \binom{2k+1}{k+1} \times \tilde{H}_{2k+1}(\underbrace{\omega_m, \ldots, \omega_m}_{(k+1)\times}, \underbrace{-\omega_m, \ldots, -\omega_m}_{k\times}). \quad (15)$$

Here, it is assumed without loss of generality that the Volterra kernels are symmetric. The two-tone response of the complex Volterra model in equation (15) can also be rewritten in the following form $$\tilde{y}_f(t) = |\nu(a, \omega_m)| \exp(j(\omega_m t + \phi + \arg\{\nu(a, \omega_m)\})) \quad (16)$$

where $$\nu(a, \omega_m) = \sum_{k=0}^{\lceil L/2 \rceil - 1} \left(\frac{a}{2}\right)^{2k+1} \binom{2k+1}{k+1} \tilde{H}_{2k+1}(\underbrace{\omega_m, \ldots, \omega_m}_{(k+1)\times}, \underbrace{-\omega_m, \ldots, -\omega_m}_{k\times}) \quad (17)$$

describes a complex function which depends on both, the signal amplitude a and the modulation frequency $\omega_m$ of the input signal. Again, as already explained in conjunction with equation (8), equation (16) is in a similar form as the response of a quasi-memoryless system resulting in that $\tilde{H}_{2k+1}(\omega_1, \ldots, \omega_{2k+1})$ can be calculated on the basis of a simple one or two-tone measurement by sweeping the frequency and amplitude of the RF input signal.

The method for determining the transfer functions of linear filters in a model network of a nonlinear circuitry by two-tone AM/AM and AM/PM measurements can be analogously be applied for calculation of filter transfer functions of a predistorter preceding an amplifier. The predistorter has a design corresponding to the memory polynomial design of the amplifier model depicted in FIG. 1, i.e. includes static nonlinearities and linear filters. The predistorter filter transfer functions can be derived from the filter transfer functions calculated for the amplifier model as outlined above.

Therefore the present invention contemplates a method of configuring a predistorter unit in conjunction with the use of nonlinear circuitry such as a power amplifier operated in a nonlinear range in order to operate at high efficiency. Such configuration then includes performing amplitude-amplitude and amplitude phase measurements and calculating the transfer functions for the nonlinear circuitry and using such results to configure the predistorter. In the above fashion, the output of the nonlinear circuitry is substantially linear with respect to the input of the predistorter, thereby reducing distortion and advantageously decreasing the bit error rate in communication systems.

While the invention has been illustrated and described with respect to one or more implementations, alterations and/or modifications may be made to the illustrated examples without departing from the spirit and scope of the appended claims. In particular regard to the various functions performed by the above described components or structures (assemblies, arrangement, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for determining a model network of nonlinear circuitry having an input and an output, the model network comprising one or more static nonlinear elements and a plurality of linear filters with transfer functions, comprising:
    performing an input amplitude-to-output amplitude measurement of the nonlinear circuitry,
    performing an input amplitude-to-output phase measurement of the nonlinear circuitry, and
    calculating the transfer functions of the linear filters on the basis of results of the input amplitude-to-output amplitude measurement and input amplitude-to-output phase measurement.

2. The method of claim 1, wherein the input amplitude-to-output phase (AM/PM) measurement comprises:
    coupling a test signal into the input of the nonlinear circuitry;
    sweeping a frequency and an amplitude of the test signal; and
    measuring a phase of a signal at the output of the nonlinear circuitry over the swept frequency and swept amplitude test signal.

3. The method of claim 2, wherein the test signal comprises two tones of different frequencies, and the frequency for sweeping is the difference between the different frequencies of the two tones.

4. The method of claim 3, wherein the test signal has exactly two tones of different frequencies.

5. The method of claim 1, wherein the input amplitude-to-output amplitude measurement comprises:
coupling a test signal into the input of the nonlinear circuitry;
sweeping a frequency and an amplitude of the test signal; and
measuring an amplitude of a signal at the output of the nonlinear circuitry over the swept frequency and swept amplitude test signal.

6. The method of claim 1, further comprising using a two-tone network analyzer for performing the measurements.

7. The method of claim 1, wherein performing the input amplitude-to-output amplitude measurement and the input amplitude-to-output phase measurement of the nonlinear circuitry provides a set of measurement result vectors, and wherein complex value elements of each measurement result vector represent the magnitude and phase of the output signal for different input signal amplitudes at a given input signal frequency.

8. The method of claim 7, wherein calculating the transfer functions comprises calculating transfer function values of the filters on the basis of the set of measurement result vectors.

9. The method of claim 1, wherein the model network comprises a baseband model network of the nonlinear circuitry using memory polynomials.

10. The method of claim 1, wherein the nonlinear circuitry comprises a power amplifier.

11. A method for configuring a predistorter adapted to linearize nonlinear circuitry having an input and an output, the predistorter comprising one or more static nonlinear elements and a plurality of linear filters with transfer functions, comprising:
performing an input amplitude-to-output amplitude measurement of the nonlinear circuitry,
performing an input amplitude-to-output phase measurement of the nonlinear circuitry, and
calculating the transfer functions of the linear filters of the predistorter on the basis of results of the input amplitude-to-output amplitude measurement and input amplitude-to-output phase measurement.

12. The method of claim 11, wherein the input amplitude-to-output phase measurement comprises:
coupling a test signal into the input of the nonlinear circuitry;
sweeping a frequency and an amplitude of the test signal; and
measuring a phase of a signal at the output of the nonlinear circuitry over the swept frequency and swept amplitude test signal.

13. The method of claim 12, wherein the test signal comprises two tones of different frequencies, and the frequency for sweeping is the difference between the different frequencies of the two tones.

14. The method of claim 13, wherein the test signal has exactly two tones of different frequencies.

15. The method of claim 11, wherein the input amplitude-to-output amplitude measurement comprises:
coupling a test signal into the input of the nonlinear circuitry;
sweeping a frequency and an amplitude of the test signal; and
measuring an amplitude of a signal at the output of the nonlinear circuitry over the swept frequency and swept amplitude test signal.

16. The method of claim 11, further comprising using a two-tone network analyzer for performing the measurements.

17. The method of claim 11, wherein performing the input amplitude-to-output amplitude measurement and the input amplitude-to-output phase measurement of the nonlinear circuitry provides a set of measurement result vectors, and wherein complex value elements of each measurement result vector represent the magnitude and phase of the output signal for different input signal amplitudes at a given input signal frequency.

18. The method of claim 17, wherein calculating the transfer functions comprises calculating transfer function values of the filters on the basis of the set of measurement result vectors.

19. The method of claim 11, wherein the predistorter comprises a baseband predistorter, and wherein the static nonlinear elements and linear filters thereof are configured to represent memory polynomials.

20. A circuit for analyzing nonlinear circuitry having an input and an output, the nonlinear circuitry being modeled by a model network comprising one or more static nonlinear elements and a plurality of linear filters with transfer functions, comprising:
a test signal generator coupled to the input of the nonlinear circuitry;
a measurement unit coupled to the output of the nonlinear circuitry and configured to perform an input amplitude-to-output amplitude measurement and an input amplitude-to-output phase measurement of the nonlinear circuitry; and
a calculation unit operably coupled to the measurement unit and adapted to calculate the transfer functions on the basis of results of the input amplitude-to-output amplitude measurement and input amplitude-to-output phase measurement.

21. The circuit of claim 20, wherein the test signal generator is adapted to couple a test signal into the input of the nonlinear circuitry and sweep a frequency and an amplitude of the test signal.

22. The circuit of claim 21, wherein the test signal comprises two tones of different frequencies, and the frequency for sweeping is the difference between the different frequencies of the two tones.

23. The circuit of claim 22, wherein the test signal has exactly two tones of different frequencies.

24. The circuit of claim 20, wherein the measurement unit is further configured to record a set of measurement result vectors, wherein complex value elements of each measurement result vector represent magnitude and phase of the output signal for different input signal amplitudes at a given input signal frequency.

25. The circuit of claim 24, wherein the calculation unit is adapted to calculate the transfer functions of the filters on the basis of the set of measurement result vectors.

26. A circuit for determining a configuration of a predistorter to linearize a nonlinear circuitry having an input and an output, the predistorter comprising one or more static nonlinear elements and a plurality of linear filters with transfer functions, comprising:
a test signal generator coupled to the input of the nonlinear circuitry;
a measurement unit coupled to the output of the nonlinear circuitry and configured to perform an input amplitude-to-output amplitude measurement and an input amplitude-to-output phase measurement of the nonlinear circuitry; and
a calculation unit operably coupled to the measurement unit and adapted to calculate the transfer functions on the basis of results of the input amplitude-to-output amplitude measurement and input amplitude-to-output phase measurement.

27. The circuit of claim 26, wherein the test signal generator is adapted to couple a test signal into the input of the nonlinear circuitry and sweep a frequency and an amplitude of the test signal.

28. The circuit of claim 27, wherein the test signal comprises two tones of different frequencies, and the frequency for sweeping is the difference between the different frequencies of the two tones.

29. The circuit of claim 28, wherein the test signal has exactly two tones of different frequencies.

30. The circuit of claim 26, wherein the measurement unit is further configured to record a set of measurement result vectors, wherein complex value elements of each measurement result vector represent the magnitude and phase of the output signal for different input signal amplitudes at a given input signal frequency.

31. The circuit of claim 30, wherein the calculation unit is adapted to calculate the transfer functions of the filters on the basis of the set of measurement result vectors.

32. The circuit of claim 31, wherein the calculation unit is adapted to calculate transfer functions from the frequency responses of the filters.

33. The circuit of claim 26, wherein the predistorter comprises a baseband predistorter, and wherein the static nonlinear elements and linear filters thereof are configured to represent memory polynomials.

\* \* \* \* \*